United States Patent
Campbell et al.

(10) Patent No.: US 9,148,983 B2
(45) Date of Patent: Sep. 29, 2015

(54) SEPARATE CONTROL OF COOLANT FLOW THROUGH COOLANT CIRCUITS

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 293 days.

(21) Appl. No.: 13/781,993

(22) Filed: Mar. 1, 2013

(65) Prior Publication Data

US 2014/0126151 A1 May 8, 2014

Related U.S. Application Data

(63) Continuation of application No. 13/671,887, filed on Nov. 8, 2012.

(51) Int. Cl.
*G06F 19/00* (2011.01)
*H05K 7/20* (2006.01)
(Continued)

(52) U.S. Cl.
CPC .......... *H05K 7/2079* (2013.01); *H05K 7/20836* (2013.01); *G05D 23/1934* (2013.01); *G06F 1/206* (2013.01); *Y02B 60/1275* (2013.01)

(58) Field of Classification Search
CPC .. H05K 7/2079; H05K 7/20836; G06F 1/206; G05D 23/1934; Y02B 60/1275

USPC .......................................... 700/282; 361/699
See application file for complete search history.

(56) References Cited

U.S. PATENT DOCUMENTS

| 7,808,780 | B2 | 10/2010 | Brunschwiler et al. |
| 7,944,694 | B2 | 5/2011 | Campbell et al. |

(Continued)

FOREIGN PATENT DOCUMENTS

JP 2012-05449 A 3/2012

OTHER PUBLICATIONS

Campbell et al., Office Action for U.S. Appl. No. 13/671,887, filed Nov. 8, 2012 (U.S. Patent Publication No. 2014/0126149 A1), dated Feb. 11, 2015 (8 pages).

(Continued)

*Primary Examiner* — Michael D Masinick
(74) *Attorney, Agent, or Firm* — Margaret A. McNamara, Esq.; Kevin P. Radigan, Esq.; Heslin Rothenberg Farley & Mesiti P.C.

(57) ABSTRACT

Methods are provided for automated coolant flow control for, for instance, facilitating cooling of multiple different electronic systems. The methods include, for instance, automatically controlling coolant flow to a plurality of coolant circuits, and for a coolant circuit i of the coolant circuits: automatically determining the heat load transferred to coolant flowing through coolant circuit i, and automatically controlling coolant flow through coolant circuit i based on the determined heat load transferred to the coolant. The different coolant circuits may have the same or different coolant flow impedances, and flow through the different coolant circuits may be controlled using different heat load-to-coolant ranges for the different circuits.

14 Claims, 7 Drawing Sheets

(51) Int. Cl.
*G05D 23/19* (2006.01)
*G06F 1/20* (2006.01)

(56) References Cited

U.S. PATENT DOCUMENTS

| | | | |
|---|---|---|---|
| 8,094,452 B1 | 1/2012 | Carlson et al. | |
| 2002/0023447 A1* | 2/2002 | Podtchereniaev et al. | 62/217 |
| 2008/0092577 A1 | 4/2008 | Martin | |
| 2008/0158818 A1 | 7/2008 | Clidaras et al. | |
| 2009/0205416 A1* | 8/2009 | Campbell et al. | 73/202.5 |
| 2009/0223234 A1* | 9/2009 | Campbell et al. | 62/127 |
| 2010/0032142 A1 | 2/2010 | Copeland et al. | |
| 2010/0314094 A1 | 12/2010 | Hall | |
| 2011/0060470 A1* | 3/2011 | Campbell et al. | 700/282 |
| 2011/0100618 A1 | 5/2011 | Carlson | |
| 2011/0132579 A1 | 6/2011 | Best et al. | |
| 2012/0127657 A1 | 5/2012 | Keisling et al. | |
| 2014/0126149 A1 | 5/2014 | Campbell et al. | |

OTHER PUBLICATIONS

Campbell et al., "Separate Control of Coolant Flow Through Coolant Circuits", U.S. Appl. No. 13/671,887, filed Nov. 8, 2012.

* cited by examiner

SEPARATE CONTROL OF COOLANT FLOW THROUGH COOLANT CIRCUITS

CROSS-REFERENCE TO RELATED APPLICATION

This application is a continuation of U.S. Ser. No. 13/671,887, filed Nov. 8, 2012, and entitled "Separate Control of Coolant Flow through Coolant Circuits", and which is hereby incorporated herein by reference in its entirety.

BACKGROUND

As is known, operating electronic components, such as electronic devices, produce heat. This heat should be removed from the devices in order to maintain device junction temperatures within desirable limits, with failure to remove heat effectively resulting in increased device temperatures, and potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. For example, power dissipation, and therefore heat production, increases as device operating frequencies increase. Also, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices, and electronic system containing such devices, solely by traditional air cooling methods, such as by using air cooled heat sinks with heat pipes or vapor chambers. Such air cooling techniques are inherently limited in their ability to extract heat from electronic components with moderate to high power density. Liquid-cooling of one or more electronic components may be beneficially employed in combination with, or even as a replacement to, conventional air-cooling of components.

BRIEF SUMMARY

A number of issues may arise with a liquid-cooling electronics approach. For instance, different electronic systems or racks of a data center may dissipate different, time-varying amounts of heat.

In one aspect, the shortcomings of the prior art are overcome and additional advantages are provided through the provision of a method which includes: automatically determining a heat load transferred to coolant flowing through a coolant circuit facilitating cooling of an electronic system; and automatically controlling coolant flow through the coolant circuit based on the determined heat load transferred to the coolant.

In another aspect, a method is provided which includes: automatically controlling coolant flow to a plurality of coolant circuits facilitating cooling of a plurality of respective electronic systems. The automatically controlling includes for a cooling circuit i of the plurality of cooling circuits facilitating cooling an electronic system i of the plurality of electronic systems: automatically determining a heat load transferred to coolant flowing through cooling circuit i; and automatically controlling coolant flow through the coolant circuit i based on the determined heat load transferred to the coolant.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system, electronic system, or information technology equipment, and may comprise, for example, one or more stand-alone computer processors having high-, mid- or low-end processing capability. In one embodiment, an electronics rack may comprise one or more electronic systems. "Electronic subsystem" may refer to any sub-housing, blade, book, drawer, node, compartment, board, etc., having one or more heat-generating electronic components disposed therein or thereon. An electronic subsystem within an electronics rack may be movable or fixed relative to the electronics rack, with the rack-mounted electronic drawers of a rack unit and blades of a blade center system being two examples of subsystems of an electronics rack to be cooled. In one embodiment, an electronic system may comprise one or more electronic subsystems and include one or more electronic components of the same or different types, and may be, in one specific example, a server unit.

"Electronic component" refers to any heat generating electronic component of, for example, an electronic system or other unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", or "liquid-cooled structure" refer to any conventional thermally conductive structure having one or more channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing, for example, one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

Figure 1:
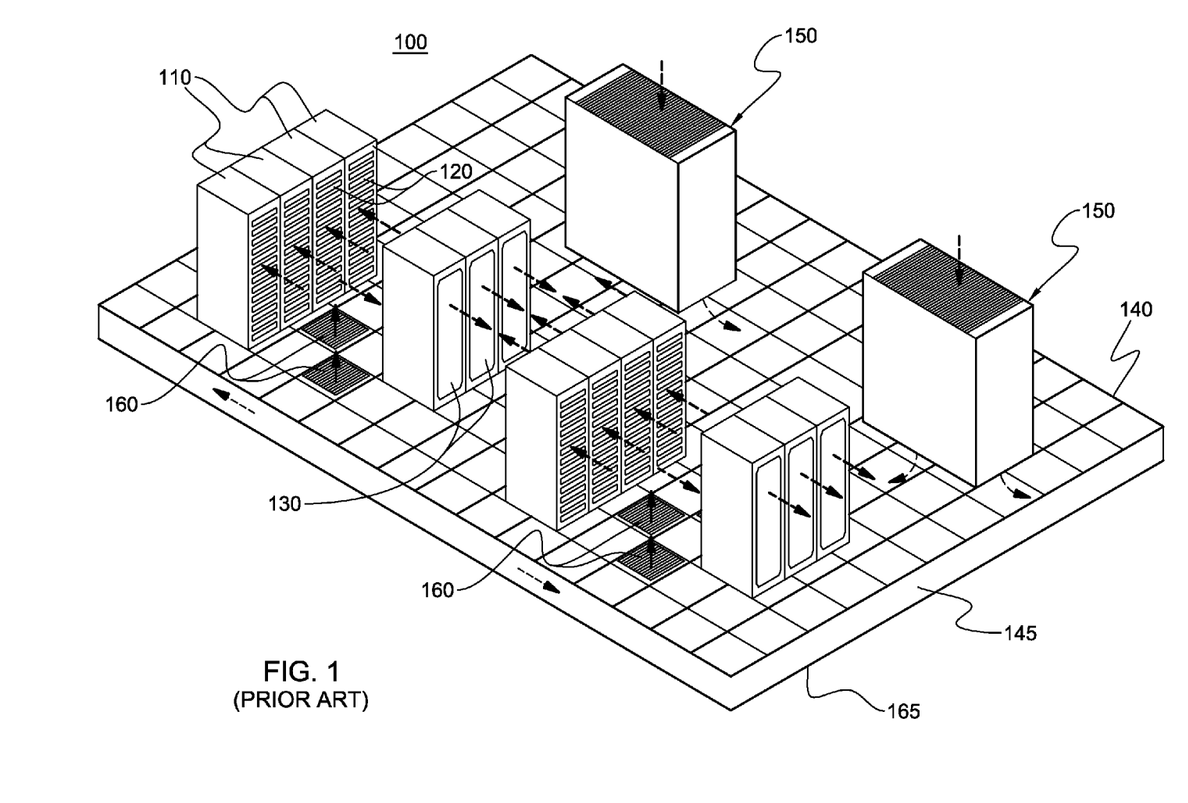
FIG. 1. depicts one embodiment of a conventional raised floor layout of an air-cooled data center.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the backs, that is, air outlet sides 130, of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise in part exhausted air from the "hot" aisles of the computer installation defined, for example, by opposing air outlet sides 130 of electronics racks 110.

Figure 2:
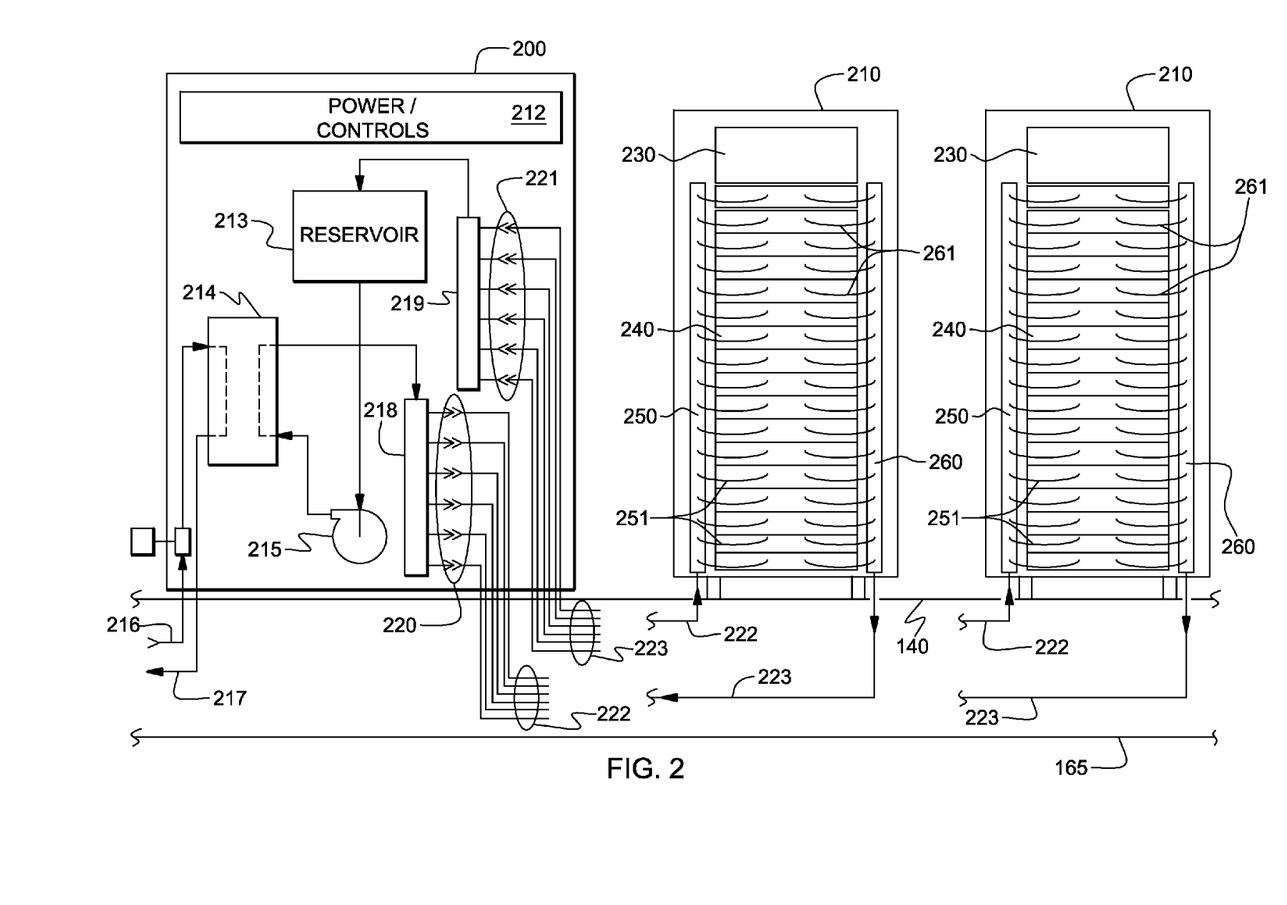
FIG. 2 depicts one embodiment of a coolant distribution unit facilitating liquid-cooling of electronics racks of a data center, in accordance with one or more aspects of the present invention.
Figure 3:
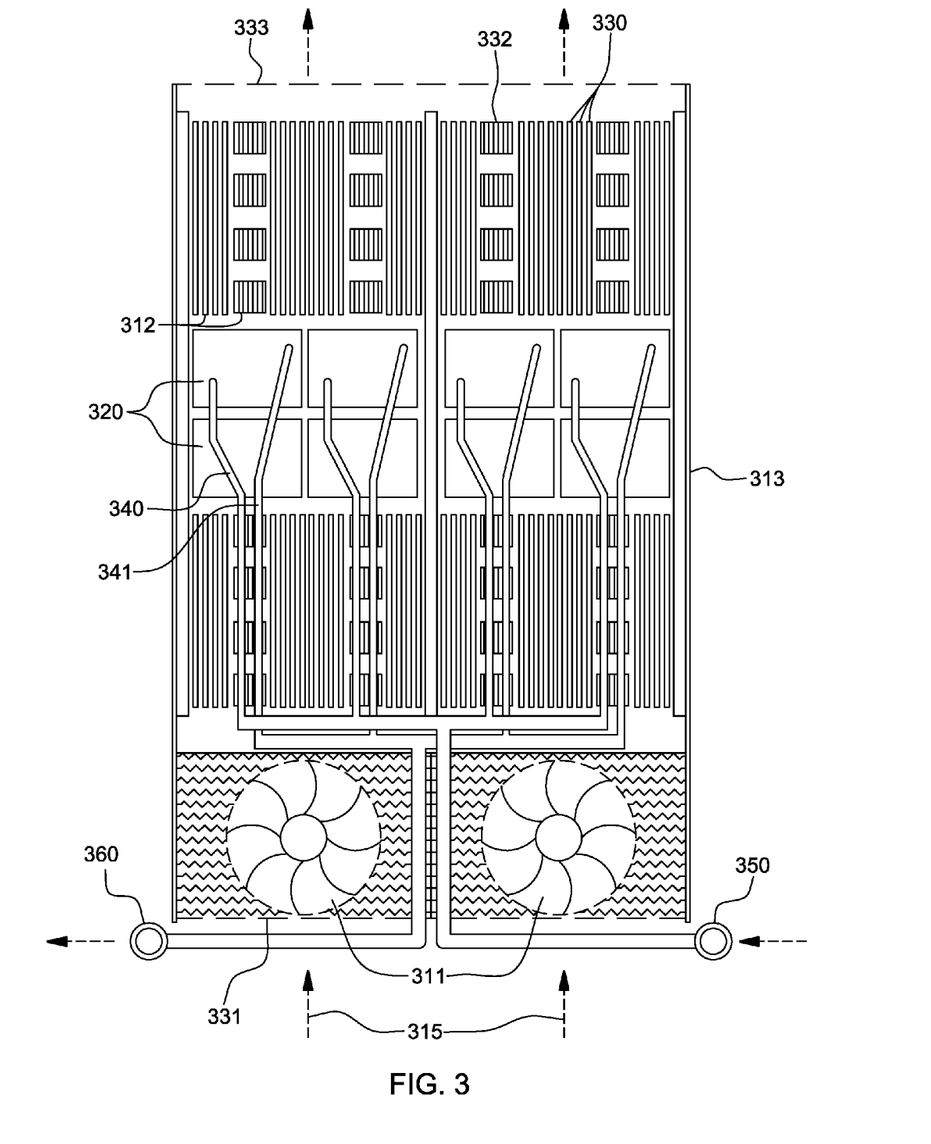
FIG. 3 is a plan view of one embodiment of an electronic subsystem (or node) layout, illustrating an air and liquid-cooling apparatus for cooling components of the electronic subsystem, in accordance with one or more aspects of the present invention.

Due to the ever-increasing airflow requirements through electronics racks, and the limits of air distribution within the typical data center installation, liquid-based cooling is being combined with the above-described conventional air-cooling, or used in place of conventional air-cooling. FIGS. 2-3 illustrate one embodiment of a data center implementation employing a hybrid air- and liquid-based cooling system with one or more cold plates coupled to high heat-generating electronic devices disposed within the electronics racks.

FIG. 2 depicts one embodiment of a coolant distribution unit 200 for a data center. Within coolant distribution unit 200 is a power/control element 212, a reservoir/expansion tank 213, a heat exchanger 214, a pump 215 (often accompanied by a redundant second pump), facility coolant inlet 216 and outlet 217 supply pipes, a supply manifold 218 supplying system coolant to the electronics racks 210 via couplings 220 and lines 222, and a return manifold 219 receiving water from the electronics racks 210, via lines 223 and couplings 221. Each electronics rack includes (in one example) a power/control unit 230 for the electronics rack, multiple electronic subsystems 240, a system coolant supply manifold 250, and a system coolant return manifold 260. In this embodiment, each electronics rack 210 is disposed on raised floor 140 of the data center, with lines 222 providing system coolant to system coolant supply manifolds 250 and lines 223 facilitating return of system coolant from system coolant return manifolds 260 shown disposed in the supply air plenum between the raised floor 140 and the base or sub-floor 165.

In the embodiment illustrated, the system coolant supply manifold 250 provides system coolant to the cooling systems of the electronic subsystems (and more particularly, for example, to liquid-cooled cold plates thereof) via flexible hose connections 251, which are disposed between the supply manifold and the respective electronic subsystems within the rack. Similarly, system coolant return manifold 260 is coupled to the electronic subsystems via flexible hose connections 261. Quick connect couplings may be employed at the interface between flexible hoses 251, 261 and the individual electronic subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 210 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic subsystem 313 component layout wherein one or more air moving devices 311 provide forced air flow 315 to cool multiple components 312 within electronic subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic subsystem 313, and partially arrayed near back 333 of electronic subsystem 313. Also, in the embodiment of FIG. 3, memory modules 330 and the memory support modules 332 are cooled by air flow 315 across the electronic subsystem.

The illustrated liquid-based cooling system further includes multiple coolant-carrying tubes 340, 341 connected to and in fluid communication with liquid-cooled cold plates 320. The coolant-carrying tubes 340, 341 comprise coolant supply tubes 340 and coolant return tubes 341, which are respectively in fluid communication with a system coolant supply manifold 350 and a system coolant return manifold 360. In this manner, system coolant is circulated through electronic subsystem 313, and in particular, liquid-cooled cold plates 320 thereof, to facilitate removal of heat from high-heat-generating components of the electronic subsystem, such as processor modules disposed within the subsystem.

Note that the hybrid air and liquid-based cooling system depicted in FIGS. 2 & 3 is presented by way of example only. In an alternate embodiment, most, if not all, of the heat dissipated by the electronic subsystems, systems, or racks, may be removed via the liquid-based cooling system.

Conventionally, a coolant distribution unit (CDU) for a liquid-based cooling system, such as the CDU described above in connection with FIG. 2, buffers system coolant from facility-chilled water or coolant, enabling a controlled, system coolant environment for temperature, pressure, cleanliness, and chemistry. For example, a coolant distribution unit may provide coolant to a cooled electronic system of a data center at a controlled temperature above dew point.

Conventionally, the coolant distribution unit is configured to distribute coolant flow to specific, known cooled electronic systems, with known, controlled coolant flow impedances. For instance, the cooled electronic system may comprise one or more electronic subsystems, such as described above in connection with FIG. 3. In such cooled electronic systems, the number and configuration of cold plate assemblies, and/or air-to-coolant heat exchangers within the electronics racks or frames have known, determined flow impedances. Thus, conventionally, the coolant distribution unit has been configured to provide a constant, uniform coolant flow to such known liquid-cooled electronic systems.

Today, an entire system, or even multiple systems, can reside within a single electronics rack. Moreover, data centers can often house heterogeneous systems or racks, including electronic systems manufactured by different vendors, designed to different specifications, not shared or common among the system providers. Conventional coolant distribution units are incapable of supplying the requisite flow or pressure for liquid-cooling such multiple, disparate frames or systems.

Addressing this need, disclosed herein are coolant distribution systems and coolant distribution methods which provide a coolant distribution service capable of providing the appropriate coolant flow to, for instance, heterogeneous electronic systems with varying flow impedance characteristics. Additionally, required flow ranges for different coolant circuits within a data center may be programmable, for instance, for each coolant circuit serviced by a coolant distribution system such as disclosed herein. In function, the coolant distribution system is more a utility, providing a service to a variety of loads, as opposed to a more conventional coolant distribution unit that is designed to operate with specific, predetermined systems or data center configuration.

The coolant distribution methods and systems disclosed herein advantageously allow different coolant circuits associated with different electronic systems or racks to have different coolant flow rates, and allows the coolant flow rate through a particular coolant circuit to be dynamically controlled or varied, based on the heat load being transferred to the coolant flowing therethrough. The methods include, for instance, automatically determining a heat load transferred to coolant flowing through a coolant circuit facilitating cooling of a respective electronic system or electronics rack, and automatically controlling coolant flow through the coolant circuit based on the determined heat load transferred to the coolant. In this manner, the control methods are dynamic in that coolant flow is controlled, e.g., increased or decreased separately in a coolant circuit of a cooling system based, at least in part, on the current heat load being transferred to the coolant flowing through that coolant circuit. Different coolant circuits may have different coolant flow or pressure requirements during operation, and within a given coolant circuit, the coolant flow or pressure may change, depending upon the heat load being transferred to the coolant flowing through that cooling circuit, for instance, as compute needs of the associated electronic system or rack vary. Thus, using the control methods disclosed herein, coolant flow is customized for each coolant circuit facilitating cooling of a respective electronic system or rack in a data center, and that coolant flow may vary dynamically, that is, the flow through a particular circuit may vary with time, for example, depending on the heat load transferred to coolant flowing through that circuit.

In one aspect, the flow control facility disclosed herein advantageously provides a desired, programmed level of coolant flows to the different coolant circuits serviced by the coolant distribution system. The control facility may be implemented as a control system or controller, for instance, within the coolant distribution system itself, or alternatively, remote from the coolant distribution system. Note that as used herein, a control system or controller may comprise, by way of example, a computer or a programmable logic controller. The control system may include, for instance, a processor (e.g., a central processing unit), a memory (e.g., main memory), and multiple input/output (I/O) connections, interfaces, devices, etc., coupled together via one or more busses and/or other connections. In one application, the controller or control system couples to a variety of sensors, such as temperature, pressure, and position sensors, as well as to one or more actuators for controlling, for instance, coolant pump speed, or position of one or more proportional valves to, for instance, maintain coolant flow to a respective coolant circuit within a specified set point range. Note that the input/output sense and control arrangements may be integrated within the controller or control system, or they may be external I/O modules or devices coupled to the controller, which facilitate the desired sensing and actuation functions.

Figure 4:
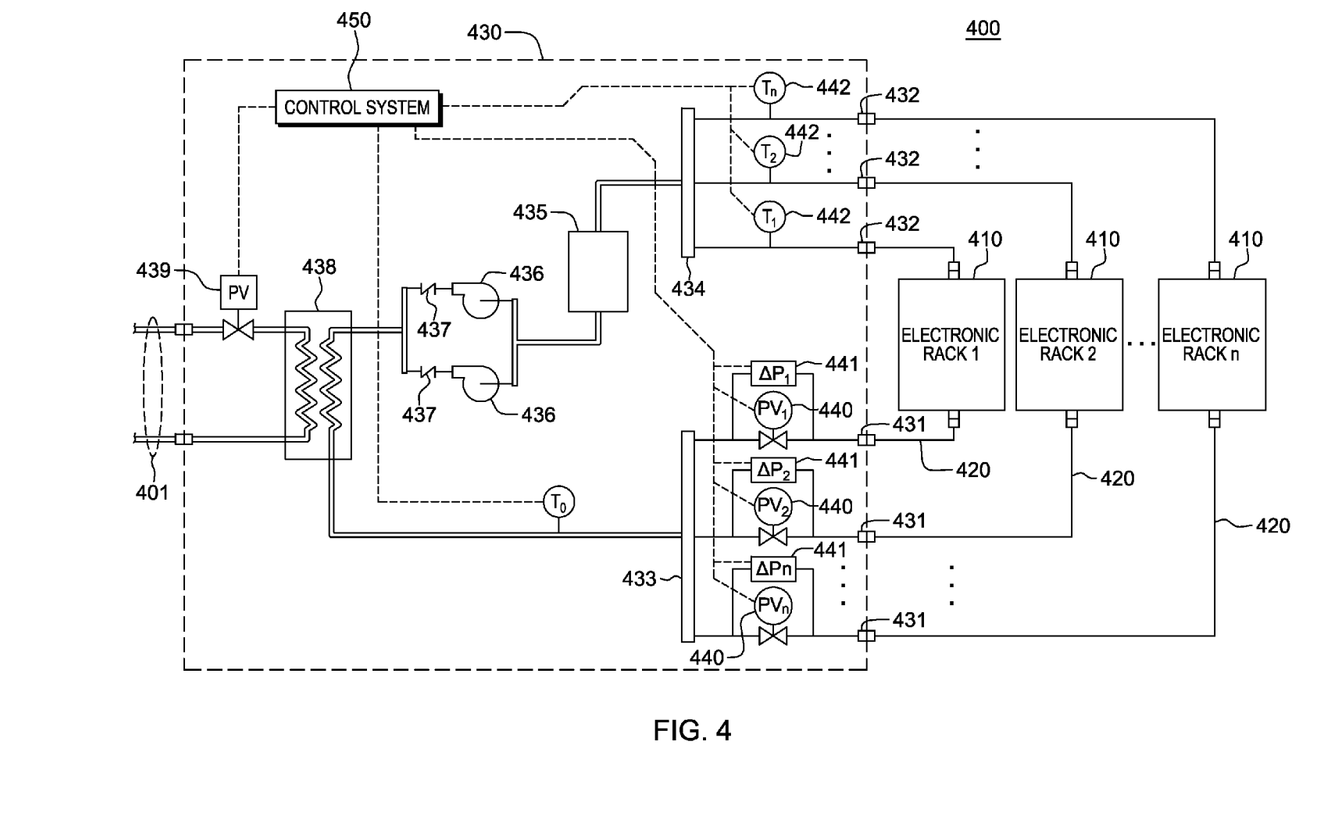
FIG. 4 is a schematic of one embodiment of a data center comprising a plurality of electronic systems or racks cooled, at least in part, by coolant flowing through separate coolant circuits, the coolant being provided by a coolant distribution system, in accordance with one or more aspects of the present invention.

By way of example, FIG. 4 depicts a schematic of one embodiment of a data center 400 comprising multiple electronic systems or racks 410 each, at least partially cooled by a coolant (e.g., a liquid coolant) passing therethrough via a respective coolant circuit 420. The coolant circuits 420 are supplied, in one example, system coolant from a coolant distribution system 430 that is capable of servicing a variety of coolant loads with a variety of coolant flow impedances across the different coolant circuits. Note that, although shown with multiple coolant circuits, the concepts disclosed herein could be employed with any number of coolant circuits. Note also that, as used herein, a "coolant circuit" is a separate coolant flow path of a cooling system which (for instance) facilitates cooling a respective electronic system or rack. The coolant flow through each flow path or coolant circuit is customizable, and each coolant circuit can have an associated, prespecified or programmed heat load-to-coolant range to which coolant flow is (in one embodiment) controlled, as described further below.

Coolant distribution system 430 includes a plurality of coolant supplies 431, (for example, coolant supply ports), and a plurality of coolant returns 432 (e.g., coolant return ports). The coolant circuits 420 couple to respective coolant supplies 431 and coolant returns 432, using for instance, respective quick connect couplings such as referenced above. A coolant supply manifold 433 and a coolant return manifold 434 distribute and aggregate, respectively, system coolant. The returning system coolant flows via coolant return manifold 434 to a coolant reservoir 435 from which coolant is pumped via one or more coolant pumps 436 through a liquid-to-liquid heat exchanger 438 for transfer of heat from the system coolant to facility coolant passing through a facility coolant loop 401 coupled via, for instance, a proportional valve 439 to liquid-to-liquid heat exchanger 438. As shown, pumps 436 serve a plurality of coolant circuits 420, and thus facilitate cooling a plurality of electronic systems or racks. In one implementation, each coolant pump can be sized to provide a discharge pressure and a total flow in excess of that provided to the coolant circuits. Check valves 437 may be associated with coolant pumps 436 and, in one embodiment, the redundant pumps are adjustable or variable speed pumps, which may be adjusted (for instance) as explained below with reference to the process control example of FIG. 5. Proportional valve (PV) 439 may also be adjusted as necessary depending, for instance, on the amount of heat being dissipated to the system coolant. In addition, proportional valve 439, which may alternatively comprise a three way proportional valve, operates to regulate the amount of facility chilled coolant flowing through the liquid-to-liquid heat exchanger 438 of the coolant distribution system 430, and hence, the temperature $T_0$ of system coolant being supplied to the coolant circuits.

Coolant is distributed from coolant supply manifold 433 through respective proportional valves 440 $PV_1, PV_2, \ldots PV_n$ to coolant supplies 431, and from there, to the coolant circuits 420 facilitating cooling of the respective electronic systems or racks. Proportional valves 440, are in one embodiment, adjustable valves which allow a controller or control system 450 to dynamically adjust the coolant flow through the respective coolant circuit 420 coupled to the associated coolant supply 431. The control system 450 employs, in the control approach described hereinbelow by way of example, the temperature $T_0$ of system coolant supplied to the coolant circuits 420 (and thus entering the respective electronic systems or frames), a pressure differential reading 441 $\Delta P_1, \Delta P_2 \ldots \Delta P_n$ across the respective proportional valves 440, and the returning coolant temperatures 442 $T_1, T_2, \ldots T_n$ egressing from the different coolant circuits 420 (which is the temperature of the coolant leaving the respective electronic systems or frames).

As noted, the proportional valves 440 are associated with respective coolant supplies 431 and thus, respective coolant circuits 420 coupled to the coolant distribution system 430. These values may be employed to regulate coolant flow through the respective coolant circuits. This is facilitated, in part, by pressure differential measurements 441 made across the proportional valves 440. These pressure differentials are the static pressure differences between the coolant flow upstream and downstream of the respective proportional valve 440. Flow in the coolant circuits can be determined using the knowledge of this differential pressure, as well as the regulation position of the respective proportional valve 440. Temperature sensors 442 are located in each coolant circuit return or at the coolant returns 432 of coolant distribution system 430 so that the heat loads transferred to coolant flowing through the respective coolant circuits can be determined.

This can be accomplished using equations (1) and (2) below:

$$G_i = f(\Delta P_i, X) \quad (1)$$

$$Q_i = \rho G_i C_p (T_i - T_o) \quad (2)$$

where:
 $G_i$=volumetric flow rate to coolant circuit i;
 $\Delta P_i$=proportional valve pressure differential for valve i associated with coolant circuit i.
 $X_i$=regulation position of proportional valve i;
 $Q_i$=heat load to coolant transfer within coolant circuit i;
 $\rho$=coolant density;
 $C_p$=coolant specific heat;
 $T_i$=return coolant temperature of coolant in coolant circuit i; and
 $T_0$=common supply coolant temperature to the coolant circuits.

Figure 6:
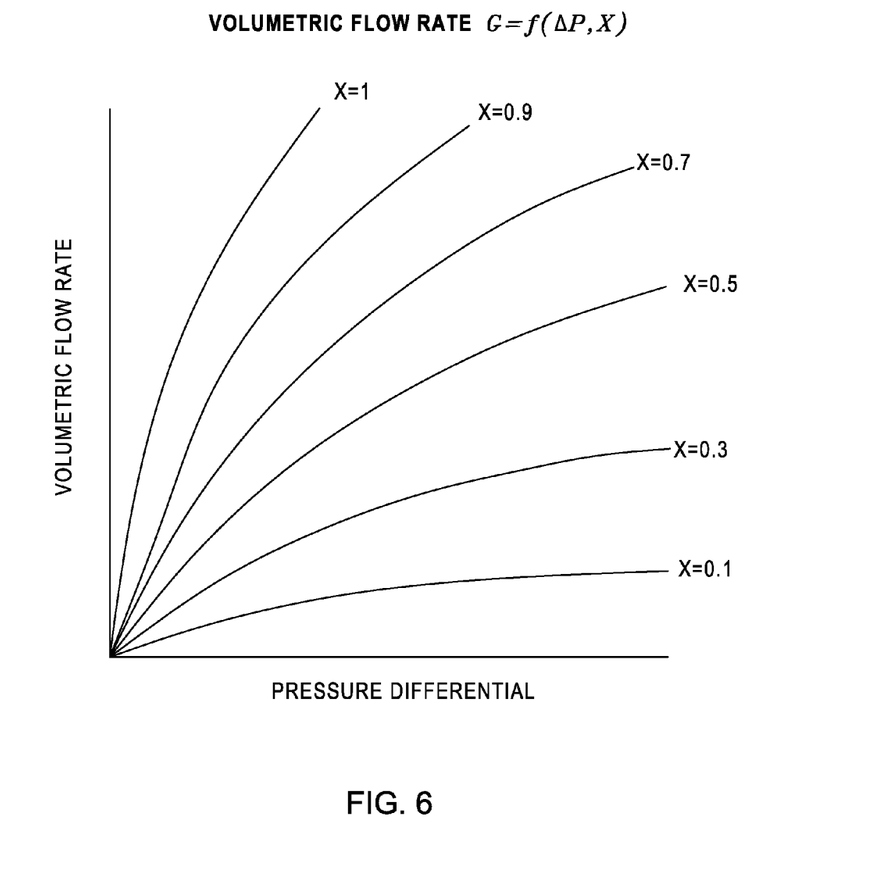
FIG. 6 is a graph of volumetric flow rate verses pressure differential for multiple regulation positions of a proportional valve controlling, at least in part, coolant flow to a respective coolant circuit of a cooling system, in accordance with one or more aspects of the present invention.

The volumetric flow rate $G_i$ for a particular coolant circuit i can be correlated to a regulation position of the associated proportional valve 440, and the pressure differential ($\Delta P_i$) 441 across that proportional valve for different regulation positions or settings. By way of example, FIG. 6 is a graph of different volumetric flow rates versus pressure differentials for different regulation positions of a proportional valve between, for instance, full closed and full open). Thus, for a given regulation position and a determined pressure differential, the volumetric flow rate at a particular coolant supply 431 can be ascertained by one skilled in the art. Note in this regard, that the volumetric flow rate G can be alternatively described as $G = A(\Delta P)^B$, where $A = f_1(X)$ and $B = f_2(X)$. In accordance with aspects of the invention disclosed herein, the control system 450 may automatically implement the coolant flow adjustments described herein, based (at least in part) on the heat load transferred to coolant flowing through the respective coolant circuits.

Note that a heat load-to-coolant set point ($Q_{sp}$) for a given electronics rack or coolant circuit servicing that rack can be established by a combination of a direct electrical power measurement, and by predicting or anticipating operational compute states. For example, when an electronic system transitions from an idle state (with little or no compute work being done) to a compute state (with compute work being performed), an anticipated heat load for the compute state could be acted upon by the control process before the actual transition takes place. Transitions in work load type or amount can also be factored into a predictive process implemented by the coolant flow control system.

In the following discussion, the terms of Table 1 below are employed.

TABLE 1

| Term | Definition |
| --- | --- |
| $C_p$ | Coolant specific heat (J/kgK). |
| $G_i$ | Volumetric flow rate through coolant circuit i cooling an electronic rack i. |
| i | Incremental integer. |
| n | Number of electronics systems or racks being cooled. |
| $PV_i$ | Proportional valve regulating flow to coolant circuit i. |
| $\rho$ | Coolant density (kg/m³). |
| $Q_i$ | Measured heat load transferred to coolant from electronics rack i to coolant circuit i. |
| $Q_{sp\_i}$ | Heat load-to-coolant set point for coolant circuit i. |
| $Q_{sp\_range\_i}$ | Range (tolerance) around/associated with $Q_{sp\_i}$. |
| $Q_{spl\_i}$ | Lower heat load-to-coolant set point for coolant circuit i. |
| $Q_{spu\_i}$ | Upper heat load-to-coolant set point for coolant circuit i. |

TABLE 1-continued

| Term | Definition |
| --- | --- |
| $T_i$ | Returning coolant temperature from coolant circuit i associated with electronic system or rack i. |
| $T_0$ | Supply coolant temperature (entering the coolant circuits). |
| $X_i$ | Valve position of proportional valve $PV_i$. |
| $X_{max}$ | Maximum proportional valve regulation position. |
| $X_{min}$ | Minimum proportional valve regulation position. |

Figure 5:
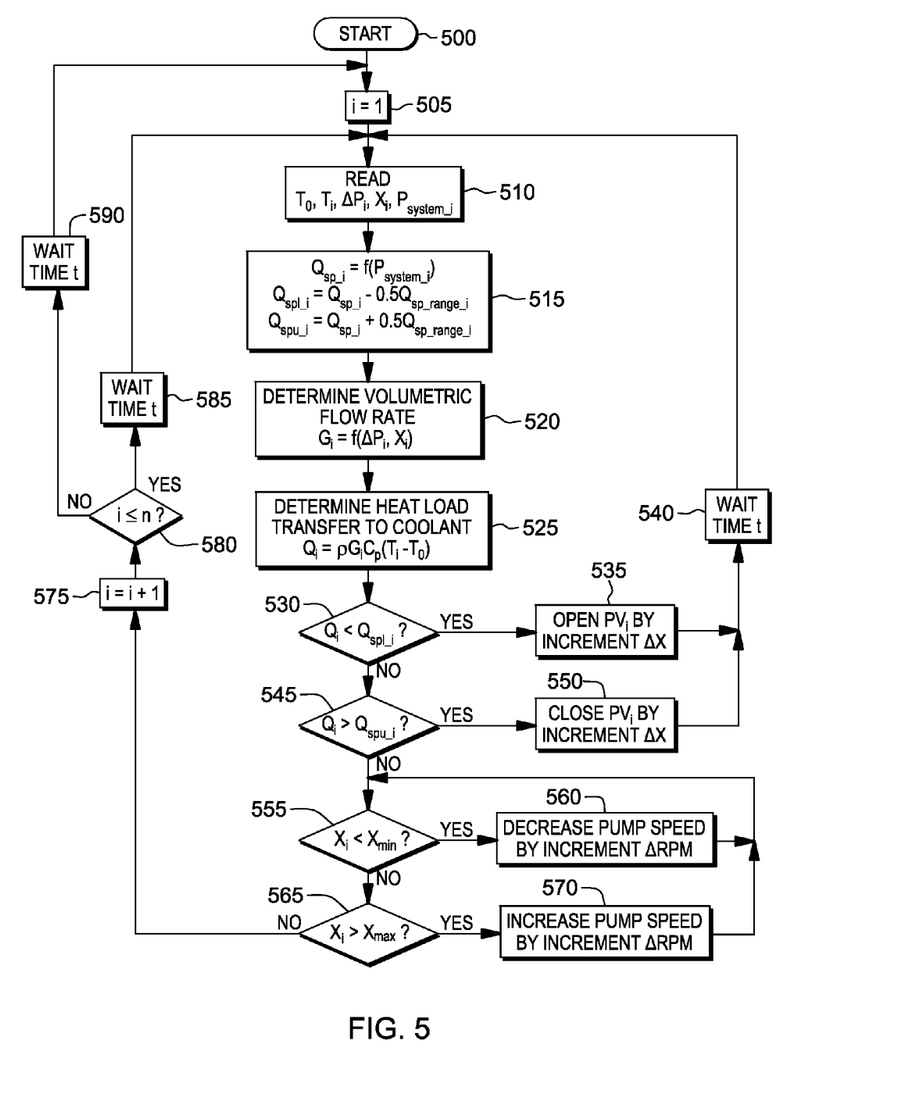
FIG. 5 depicts one embodiment of a control process for controlling coolant flow through multiple coolant circuits facilitating cooling of multiple electronic systems or racks, in accordance with one or more aspects of the present invention.

The determined heat loads to coolant can be compared to respective, specified heat load-to-coolant ranges about a heat load-to-coolant set point $Q_{sp}$. The set point can be a constant that is ascertained and input for each different electronics rack, that is, for each respective coolant circuit servicing the respective electronic system or rack, or could be determined in real time by defining the set point as, for instance, a function of the electronics rack power ($P_{system}$). If controlled dynamically, then operational speed of the pumps within the coolant distribution system could also be dynamically adjusted to take advantage of lower coolant flow requirements for lower power states. FIG. 5 described below presents one process for controlling coolant flow locally through the respective coolant circuits, and globally controlling operational speed of the pumps within the coolant distribution system.

Referring to the process control example of FIG. 5, coolant flow control processing 500 begins by, in one embodiment, initializing incremental integer i equal to 1 505, and then reading the coolant supply temperature $T_0$, coolant return temperature for coolant circuit i, ($T_i$), pressure differential ($\Delta P_i$) across the proportional valve ($PV_i$) associated with the coolant supply i, or control circuit i, as well as the regulation position ($X_i$) for that proportional valve ($PV_i$) 510. Processing then determines, in this embodiment, a heat load-to-coolant set point ($Q_{sp\_i}$) for coolant circuit i servicing electronics rack i 515. As explained above, the heat load-to-coolant set point for a particular coolant circuit can be measured or determined as a function of the power being dissipated, or anticipated to be dissipated, by the associated electronic system or rack. A lower heat load-to-coolant set point limit ($Q_{spl\_i}$) is defined by subtracting from the heat load-to-coolant set point ($Q_{sp\_i}$), for instance, half of a desired set point range ($Q_{sp\_range\_i}$). An upper set point limit ($Q_{spu\_i}$) is similarly ascertained by adding half of the desired set point range ($Q_{sp\_range\_i}$) to the determined heat load-to-coolant set point for coolant circuit i (cooling electronic system i or electronics rack i). Once the upper and lower heat load-to-coolant set points are determined, the volumetric flow rate is determined for coolant circuit i 520, for instance, as described above. The heat load transferred to coolant is then determined for coolant circuit i 525, employing, for instance, equation (2) above.

Processing then determines whether the heat load transferred to coolant ($Q_i$) determined for coolant circuit i is less than the lower heat load-to-coolant set point 530, and if "yes", processing opens the associated proportional valve ($PV_i$) by an increment ($\Delta X$) 535 to increase coolant flow through coolant circuit i. After opening the proportional valve by increment $\Delta X$, processing waits a time interval t 540, before returning to again read the coolant supply temperature ($T_0$), returning coolant temperature ($T_i$) for coolant return i (i.e., for coolant circuit i), the pressure differential ($\Delta P_i$) across the proportional valve associated with coolant supply i (i.e., for coolant circuit i), as well as the regulation position ($X_i$) of that proportional valve 510.

Assuming that the determined heat load-to-coolant set point is equal to or above the lower heat load-to-coolant set point for coolant circuit i, processing determines whether the current heat load-to-coolant ($Q_i$) is greater than the upper heat load-to-coolant set point ($Q_{spu\_i}$) 545, and if "yes", processing closes the associated proportional valve ($PV_i$) by an increment $\Delta X$ 550 to decrease flow of coolant through the associated coolant circuit i. After incrementing the proportional valve, processing again waits time interval t 540 before ascertaining the above-noted, current coolant temperatures, pressure differential, and regulation position for proportional valve $PV_i$.

Assuming that the determined heat load to coolant ($Q_i$) for coolant circuit i is within the specified heat load-to-coolant range, then no local adjustment of the coolant flow is required, and processing determines whether regulation position ($X_i$) of the proportional valve $PV_i$ is at a minimum proportional valve regulation position ($X_{min}$) 555. If "yes", processing decreases the speed of the one or more pumps 436 (see FIG. 4) of the distribution system by an increment $\Delta RPM$ 560. This process continues until the regulation position ($X_i$) is at or above the minimum proportional valve regulation position ($X_{min}$). By way of specific example, the minimum proportional valve regulation position might be 0.2 on a scale of zero to 1.

Assuming that the regulation position for proportional valve $PV_i$ is at or above the minimum regulation position ($X_{min}$), then processing determines whether the regulation position for proportional valve i is above the maximum proportional valve regulation position ($X_{max}$) 565. If "yes", then processing increases the operation speed of the distribution system pump(s) by an increment $\Delta RPM$ 570 to globally increase the pressure or coolant flow rate from the pumps into the coolant supply manifold of the coolant distribution system. By way of specific example, the maximum proportional valve regulation position ($X_{max}$) might be 0.8 on a scale of zero to 1. This process continues until the regulation position of proportional valve i is at or above the minimum proportional valve regulation position ($X_{min}$), and at or below the maximum proportional valve regulation position ($X_{max}$). Thereafter, processing increments integer i 575, and determines whether all coolant circuits i, from 1 to n, have been considered 580. In this example, the total number of coolant circuits n equals the total number of electronic systems or racks being separately cooled by the respective coolant circuits.

Assuming that integer i is less than or equal to n, then processing waits a time interval t 585 before again reading the above-noted coolant temperatures, differential pressure, and regulation position for the new coolant supply i (or new coolant circuit i) 510. Once all coolant circuits (or electronic systems or racks) have been considered, processing waits a time interval t 590 before resetting incremental integer i to 1 to restart the control process. In this manner, the control system continuously, dynamically provides specified coolant flows to respective coolant circuits of a cooling system, even in the case where the associated electronic systems or racks are disparate or heterogeneous systems or racks provided, for instance, by different vendors. In addition to this, global coolant flow adjustments are automatically made by adjusting the coolant pumps to ensure that the regulation positions of the respective proportional valves remain between set minimum and maximum positions (for instance, to allow continued local control of coolant flow rates via the proportional valves).

As will be appreciated by one skilled in the art, one or more control aspects of the present invention may be embodied as a system, method or computer program product. Accordingly, one or more control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 7:
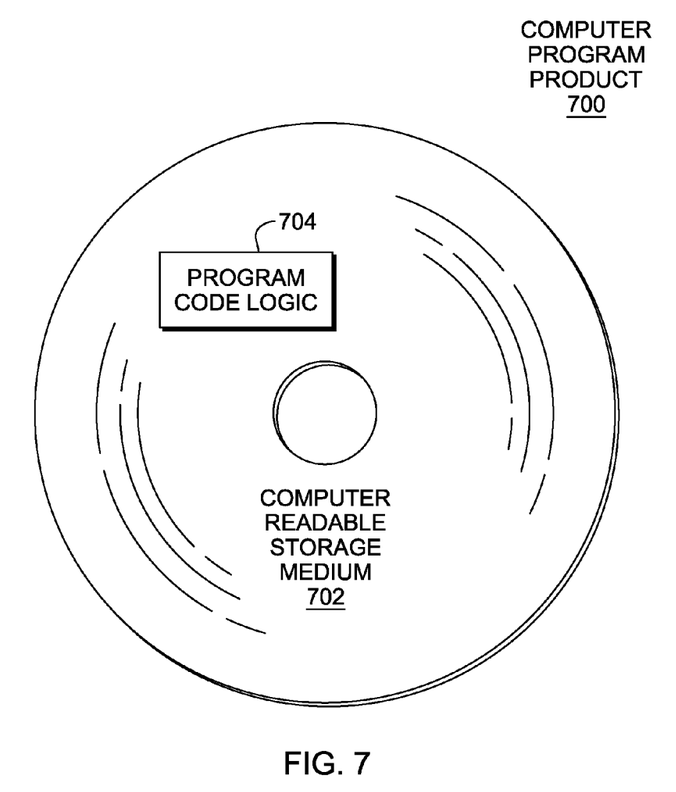
FIG. 7 depicts one embodiment of a computer program product incorporating one or more aspects of the present invention.

Referring now to FIG. 7, in one example, a computer program product 700 includes, for instance, one or more non-transitory computer readable storage media 702 to store computer readable program code means or logic 704 thereon to provide and facilitate one or more control aspects of the present invention.

Program code embodied on a computer readable medium may be transmitted using an appropriate medium, including but not limited to, wireless, wireline, optical fiber cable, RF, etc., or any suitable combination of the foregoing.

Computer program code for carrying out operations for one or more aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

One or more control aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of one or more control aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more control aspects of the present invention may be provided, offered, deployed, managed, serviced, etc. by a service provider who offers management of customer environments. For instance, the service provider can create, maintain, support, etc. computer code and/or a computer infrastructure that performs one or more control aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more control aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. Further, other types of computing environments can benefit from one or more aspects of the present invention.

As a further example, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    automatically determining a heat load transferred to coolant flowing through a coolant circuit facilitating cooling of an electronic system;
    automatically controlling coolant flow through the coolant circuit based on the determined heat load transferred to the coolant; and
    wherein the automatically determining comprises determining a volumetric flow rate of coolant through the coolant circuit and determining a temperature differential between coolant supplied to the coolant circuit and coolant returned from the coolant circuit, and ascertaining the heat load transferred to the coolant using the determined volumetric flow rate and the determined temperature differential; and
    wherein the automatically determining comprises automatically determining the heat load transferred to coolant by the equation:

$$Q_i = \rho G_i C_p (T_i - T_o)$$

wherein:
    $Q_i$=heat load transferred to coolant in the coolant circuit;
    $\rho$=density of the coolant;
    $G_i$=volumetric flow rate of the coolant through the coolant circuit;
    $C_p$=coolant specific heat;
    $T_i$=return temperature of the coolant in the coolant circuit; and
    $T_o$=supply temperature of the coolant in the coolant circuit.

2. The method of claim 1, wherein the coolant circuit comprises a proportional valve, and determining the volumetric flow rate comprises determining the volumetric flow rate as a function of a regulation position of the proportional valve, and a pressure differential across the proportional valve.

3. The method of claim 1, wherein the automatically controlling comprises comparing the determined heat load transferred to the coolant with a predetermined heat load-to-coolant range for the coolant circuit facilitating cooling of the electronic system.

4. The method of claim 3, wherein the automatically controlling comprises automatically reducing the coolant flow through the coolant circuit based on the determined heat load transferred to the coolant being below the predetermined heat load-to-coolant range for the coolant circuit.

5. The method of claim 4, wherein the coolant circuit comprises, or receives the coolant via, a proportional valve, and the automatically controlling comprises automatically adjusting a regulation position of the proportional valve to reduce the coolant flow through the coolant circuit based on the determined heat load transferred to the coolant being below the predetermined heat load-to-coolant range for the coolant circuit.

6. The method of claim 5, wherein the coolant flow within the coolant circuit is a function, at least in part, of an operational speed of a coolant pump, and the automatically controlling comprises automatically reducing the operational speed of the coolant pump based on the proportional valve reaching a set minimum regulation position.

7. The method of claim 3, wherein the automatically controlling comprises automatically increasing the coolant flow through the coolant circuit based on the determined heat load transferred to the coolant being above the predetermined heat load-to-coolant range for the coolant circuit.

8. The method of claim 7, wherein the coolant circuit comprises, or receives the coolant via, a proportional valve, and the automatically controlling comprises automatically adjusting a regulation position of the proportional valve to increase the coolant flow through the coolant circuit based on the determined heat load transferred to the coolant being below the predetermined heat load-to-coolant range for the coolant circuit.

9. The method of claim 8, wherein the coolant flow within the coolant circuit is a function, at least in part, of an operational speed of a coolant pump, and the automatically controlling comprises automatically increasing the operational speed of the coolant pump based on the proportional valve reaching a set maximum regulation position.

10. A method comprising:
   automatically controlling coolant flow to a plurality of coolant circuits facilitating cooling of a plurality of respective electronic systems, the automatically controlling comprising for a coolant circuit i of the plurality of coolant circuits facilitating cooling an electronic system i of the plurality of electronic systems:
      automatically determining a heat load transferred to coolant flowing through coolant circuit i;
      automatically controlling coolant flow through the coolant circuit i based on the determined heat load transferred to the coolant; and
   wherein the automatically determining comprises determining a volumetric flow rate of coolant through the coolant circuit i, and determining a temperature differential between coolant supplied to the coolant circuit i and coolant returned from the coolant circuit i, and ascertaining the heat load transferred to the coolant using the determined volumetric flow rate and the determined temperature differential; and
   wherein the coolant circuit i comprises a proportional valve, and determining the volumetric flow rate comprises determining the volumetric flow rate as a function of a regulation position of the proportional valve, and agressure differential across the proportional valve.

11. The method of claim 10, wherein the automatically controlling comprises automatically, separately controlling the coolant flow through each coolant circuit of at least two coolant circuits of the plurality of coolant circuits based on a respective determined heat load transferred to the coolant for that coolant circuit.

12. The method of claim 11, wherein the at least two coolant circuits of the plurality of coolant circuits compirse different coolant flow impedances.

13. The method of claim 10, wherein the automatically controlling coolant flow through the coolant circuit I comprises comparing the determined heat load transferred to the coolant within coolant circuit i with a predetermined heat load-to-coolant range for the coolant circuit i facilitating cooling electronic system i of the plurality of electronic systems.

14. A method comprising:
   automatically controlling coolant flow to a plurality of coolant circuits facilitating cooling of a plurality of respective electronic systems, the automatically controlling comprising for a coolant circuit i of the plurality of coolant circuit facilitating cooling an electronic system i of the plurality of electronic systems:
      automatically determining a heat load transferred to coolant flowing through coolant circuit i;
      automatically controlling coolant flow through the coolant circuit i based on the determined heat load transferred to the coolant; and
   wherein the automatically controlling coolant flow through the coolant circuit i comprises comparing the determined heat load transferred to the coolant within coolant circuit i with a predetermined heat load-to-coolant range for the coolant circuit i facilitating cooling electronic system i of the plurality of electronic systems; and
   wherein the automatically controlling coolant flow to the plurality of coolant circuits comprises, for each coolant circuit of at least two coolant circuits of the plurality of coolant circuits, comparing a respective determined heat load transferred to the coolant within that coolant circuit with a predetermined heat load-to-coolant range for that coolant circuit, and wherein the at least two coolant circuits of the plurality of coolant circuits have different predetermined heat load-to-coolant ranges.

* * * * *